United States Patent
Buffet et al.

(10) Patent No.: US 7,064,570 B2
(45) Date of Patent: Jun. 20, 2006

(54) METHOD FOR LOCATING $I_{DDQ}$ DEFECTS USING MULTIPLE CONTROLLED COLLAPSE CHIP CONNECTIONS CURRENT MEASUREMENT ON AN AUTOMATIC TESTER

(75) Inventors: Patrick H. Buffet, Essex Junction, VT (US); Douglas C. Heaberlin, Underhill, VT (US); Leah M. P. Pastel, Essex Junction, VT (US); Yu H. Sun, Williston, VT (US)

(73) Assignee: International Business Machines, Corporation, Armonk, NY (US)

( * ) Notice: Subject to any disclaimer, the term of this patent is extended or adjusted under 35 U.S.C. 154(b) by 246 days.

(21) Appl. No.: 10/665,321

(22) Filed: Sep. 20, 2003

(65) Prior Publication Data

US 2004/0061519 A1   Apr. 1, 2004

Related U.S. Application Data

(62) Division of application No. 09/681,917, filed on Jun. 26, 2001, now Pat. No. 6,677,774.

(51) Int. Cl.
*G01R 31/02* (2006.01)
*G01R 31/26* (2006.01)
(52) U.S. Cl. .................... 324/763; 324/765
(58) Field of Classification Search ........ 324/760–769, 324/158.1; 714/718–724, 73
See application file for complete search history.

(56) References Cited

U.S. PATENT DOCUMENTS

| 5,757,816 | A  |   | 5/1998 | Al-Assadi et al. |
| 5,889,408 | A  | * | 3/1999 | Miller ......................... 324/765 |
| 5,929,650 | A  | * | 7/1999 | Pappert et al. .............. 324/763 |
| 6,175,244 | B1 | * | 1/2001 | Gattiker et al. ............. 324/765 |
| 6,239,605 | B1 | * | 5/2001 | Miller ......................... 324/765 |
| 6,239,606 | B1 | * | 5/2001 | Miller ......................... 324/765 |
| 6,714,032 | B1 | * | 3/2004 | Reynick ..................... 324/765 |

OTHER PUBLICATIONS

"Quiscent Signal Analysis for IC Diagnosis", ITC Workshop, Oct. 5-Oct. 6, 2000. James F. Plusquellic, Chintan Patel and Ying Ouyang, Department of Computer Science & Electrical Engineering, University of Maryland, Baltimore County.

* cited by examiner

*Primary Examiner*—Vinh P. Nguyen
(74) *Attorney, Agent, or Firm*—Whitham, Curtis & Christofferson, P.C.; Robert A. Walsh

(57) ABSTRACT

A method for improving the signal-to-noise ratio in an $I_{DDQ}$ defect test is disclosed. An integrated circuit is divided into a plurality of areas and each area is provided with and bounded by terminals. An $I_{DDQ}$ defect is activated to generate $I_{DDQ}$ defect current within the integrated circuit. An amount of $I_{DDQ}$ defect current generated within each area is measured at the terminals provided thereto. Based on the $I_{DDQ}$ current measurement on each area, an $I_{DDQ}$ current map is created. By analyzing the $I_{DDQ}$ current map, the presence and location of the defect is determined. Based on the determination, the $I_{DDQ}$ defect is isolated.

19 Claims, 5 Drawing Sheets

METHOD FOR LOCATING $I_{DDQ}$ DEFECTS USING MULTIPLE CONTROLLED COLLAPSE CHIP CONNECTIONS CURRENT MEASUREMENT ON AN AUTOMATIC TESTER

This application is a divisional of Ser. No. 09/681,917; filed on Jun. 26, 2001 now U.S. Pat. No. 6,677,774.

BACKGROUND OF THE INVENTION

The present invention generally relates to an integrated circuit (IC) diagnosis technique and, more particularly, to an apparatus and a method for determining the location of an $I_{DDQ}$ defect in an integrated circuit.

Presently, there are several different types of testing methods for detecting faults in integrated circuits. However, one particular method has been widely accepted and successful in the electronics industry. This one particular method comprises a complementary metal oxide semiconductor (CMOS) integrated circuit test method which is known as quiescent power supply current, or $I_{DDQ}$, testing.

$I_{DDQ}$ testing is attractive because it can achieve high fault coverage with relatively few test patterns, and can detect certain types of unique defects (for example, subtle transistor leakage mechanisms and highly resistive bridges) that logic and functional testing may not detect.

$I_{DDQ}$ testing is based on the observation that certain commonly occurring semiconductor defects, such as bridges or shorts between metal lines, will cause an IC to draw extra supply current, even when the IC is in a "quiescent" state in which all of its intended conduction paths are turned off. Such a defect forms an unintended conduction path between two or more electrically active regions of the IC, and extra current will result (i.e., the defect is "activated") whenever these regions are at different electrical potentials.

Such a defect, which is detectable by an $I_{DDQ}$ test, will be referred to as an "$I_{DDQ}$ defect" hereafter. Also, the current resulting from a defect will be referred to as "$I_{DDQ}$ defect current". It should be noted that an $I_{DDQ}$ defect may not be in close physical proximity to the sites in the power and ground networks where the additional current enters and exits the chip. The current arising from a bridge between two signal lines, for example, has its source and sink in the two circuits which drive the bridged lines, either or both of which may be far removed from the location of the actual defect. Hereinafter, for the sake of brevity, any reference to the existence of an $I_{DDQ}$ defect within a particular physical area is intended to include the possibility that the area identified contains only a circuit of which output signal line contains a defect, and that the defect itself may in fact lie outside the area identified.

A single reading is typically obtained by applying a predetermined test pattern to the primary inputs of an IC, allowing the IC to "settle" into a quiescent state, and then measuring the current drawn by the IC in the quiescent state. An $I_{DDQ}$ test normally comprises the application of several such test patterns and measurements. Each pattern places the IC into a different electrical state, thereby increasing the likelihood of activating, and thus of detecting, any $I_{DDQ}$ defects present on the IC.

A semiconductor manufacturer's ability to improve its manufacturing yield depends upon successful physical failure analysis (PFA), in which the root cause of an IC's failure is determined. Central to successful PFA is the ability to determine the physical location of a defect on an IC. Because traditional $I_{DDQ}$ testing measures current at a single point in the IC's power supply, each reading indicates the current drawn by the entire IC. For this reason, traditional $I_{DDQ}$ measurements provide no direct information about the physical location of the defects they detect. A means for determining the location of a defect directly from $I_{DDQ}$ measurements could improve the accuracy and effectiveness of PFA, enabling more rapid improvement of manufacturing yield.

In the absence of such a method, one existing means of locating an $I_{DDQ}$ defect is software diagnosis. Given a logic simulator which can determine the internal electrical state of the IC during each $I_{DDQ}$ measurement, and an indication of which $I_{DDQ}$ measurements "failed" (detected the defect) and which "passed", $I_{DDQ}$ diagnostic software can determine likely defect sites by identifying internal circuit nodes which, if defective, could explain which patterns pass and fail.

Although test and diagnosis offer unique benefits to IC manufacturers, the effectiveness of $I_{DDQ}$ testing has been generally diminished because of its increasing difficulty of detecting $I_{DDQ}$ defect current in the presence of the overwhelmingly higher background current (e.g., substrate current). Such background current is a very typical phenomenon in modern integrated circuit devices. Even a defect-free integrated circuit draws a certain amount of background current while in a quiescent state because of a normal leakage phenomenon within individual devices (e.g., transistors) within an IC device. As the number of transistors in advanced integrated circuit devices has exponentially grown, the background current arising from their cumulative leakage has increased drastically.

Because the current resulting from an activated $I_{DDQ}$ defect is typically small, the "signal-to-noise" ratio in $I_{DDQ}$ testing (that is, the ratio of defect current to normal background current) has become so low that some IC manufacturers have abandoned $I_{DDQ}$ testing altogether as ineffective for their high-performance IC's. A means of increasing this signal-to-noise ratio would thus not only extend the applicability of $I_{DDQ}$ testing for defect detection, but would improve the capability of software diagnosis by enabling "passing" and "failing" patterns for a given IC to be distinguished more readily.

BRIEF SUMMARY OF THE INVENTION

An object of the present invention is to provide an improved and more accurate method for testing an integrated circuit by improving a ratio between defect current and background current within the integrated circuit.

Another object of the present invention is to provide a method for improving the ratio between defect current and background current for integrated circuit testing by dividing an integrated circuit into a plurality of areas and individually measuring an amount of $I_{DDQ}$ defect current generated in each area.

Still another object of the present invention is to provide an improved and accurate method of determining the presence of an $I_{DDQ}$ defect based on the measured amount of $I_{DDQ}$ defect current generated in each area.

Further, an object of the present invention is to provide an apparatus and a method for determining a location of an $I_{DDQ}$ defect within the integrated circuit based on the measured amount of $I_{DDQ}$ defect current generated in each area.

A further object of the present invention is to provide a method for creating an $I_{DDQ}$ current map of an integrated circuit based on the measured amount of $I_{DDQ}$ defect current generated in each area.

Additional objects and other features of the present invention will be set forth in part in the description which follows and will become apparent to those having ordinary skill in the art upon examination of the following or may be learned from the practice of the present invention. The objects and advantages of the present invention may be realized and obtained as particularly pointed out in the appended claims.

According to the present invention, the foregoing and other objects and advantages are achieved in part by a method of testing an integrated circuit which has a plurality of terminals on a surface thereof. The surface is divided into a plurality of areas, each area is provided with at least one of said plurality of terminals. An $I_{DDQ}$ defect is activated to generate $I_{DDQ}$ defect current within the integrated circuit. Amounts of the $I_{DDQ}$ defect current transferred to said plurality of terminals are measured. Based on the amount of said $I_{DDQ}$ defect current measured at the plurality of terminals, it is determined whether each area includes said $I_{DDQ}$ defect.

Thus, by dividing an integrated circuit into a plurality of areas and measuring the $I_{DDQ}$ defect current generated within each area, the present invention significantly increases the ratio between signal ($I_{DDQ}$ defect current) and noise (e.g., substrate leakage current). With significantly reduced noise interference, the present invention enables determining whether each area includes any $I_{DDQ}$ defect more accurately.

Also, the present invention enables determining the location of the $I_{DDQ}$ defect within the areas determined to include the $I_{DDQ}$ defect. First, one of said areas determined to include an $I_{DDQ}$ defect is selected for the $I_{DDQ}$ defect location determination. The selected area is divided into a plurality of subsections, each subsection is provided with a corresponding one of the terminals bounding the selected area. Based on the amounts of the $I_{DDQ}$ defect current measured at the terminals bounding the selected area, it is determined which subsection includes the $I_{DDQ}$ defect based on the amount of the $I_{DDQ}$ defect current measured at the terminals bounding the selected area.

Further, the present invention enables determining the location of the $I_{DDQ}$ defect within a selected subsection. The selected subsection is divided into a plurality of sub-subsections. It is determined which sub-subsection includes the $I_{DDQ}$ defect based on the ratio between (a) an amount of said $I_{DDQ}$ defect current forwarded to the terminal provided for the selected subsection and (b) an amount of a sum of said $I_{DDQ}$ defect current measured at the terminals bounding said selected area. Hence, in addition to merely detecting the presence of an $I_{DDQ}$ defect, the present invention enables the determination of the location of an $I_{DDQ}$ defect within an integrated circuit.

The application of the present invention is not limited to devices manufactured by using CMOS techniques. The present invention can be applied to any kind of IC devices which include circuitry capable of disabling DC currents, controlling power and ground supply connections or voltage levels thereof, or settling the device to be in a low current state for $I_{DDQ}$ measurement. Also, the present invention can be used with standard magnitude versus threshold $I_{DDQ}$ testing, as well as more complex schemes, such as delta $I_{DDQ}$ testing. One skilled in the art will be able to use this invention in many other applications.

BRIEF DESCRIPTION OF THE DRAWINGS

The foregoing and other advantages and aspects will be better understood from the following detailed description of a preferred embodiment of the invention with reference to the drawings, in which.

DETAILED DESCRIPTION OF THE INVENTION

The preferred embodiment of the present invention provides a method for significantly improving the "signal-to-noise" ratio in $I_{DDQ}$ testing. As previously mentioned, the usefulness of $I_{DDQ}$ testing has been significantly challenged because of its increasing difficulty of detecting $I_{DDQ}$ defect current in the presence of the overwhelmingly higher background current (e.g., substrate current).

The present invention solves this problem by dividing an integrated circuit into a plurality of areas, and measuring $I_{DDQ}$ defect current generated within each area. Since the number of transistors within each area is far less than the number of transistors distributed within the entire integrated circuit, the background current problem caused by the cumulative leakage is significantly improved. Thus, according to the present invention, the ratio between signal ($I_{DDQ}$ defect current) and noise (background current) is significantly improved, and more accurate $I_{DDQ}$ defect testing is achieved.

Figure 1:
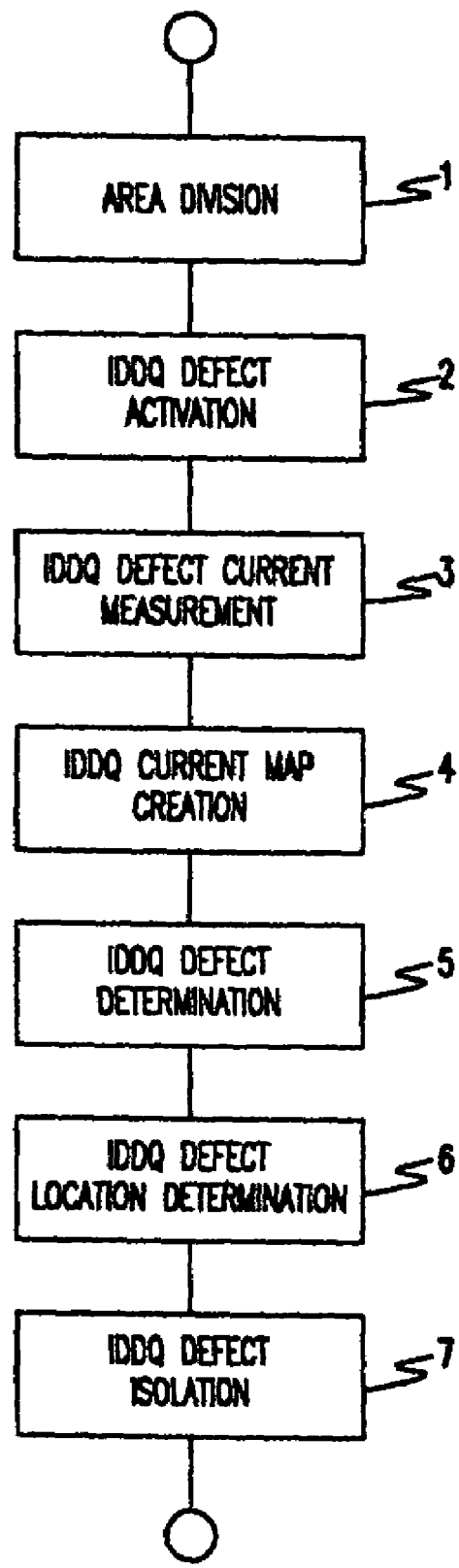
FIG. 1 depicts a flow-chart for testing an integrated circuit according to an embodiment of the present invention.

With this in mind, FIG. 1 depicts a flow-chart for performing an $I_{DDQ}$ test according to an embodiment of the present invention. The first three steps 1–3 are directed to performing an $I_{DDQ}$ test with an improved signal-to-noise ratio, and the last four steps 4–7 are related to possible applications of the $I_{DDQ}$ test result. The applications of the present inventions, however, are not limited to the exemplary application described herein.

Figure 2A:
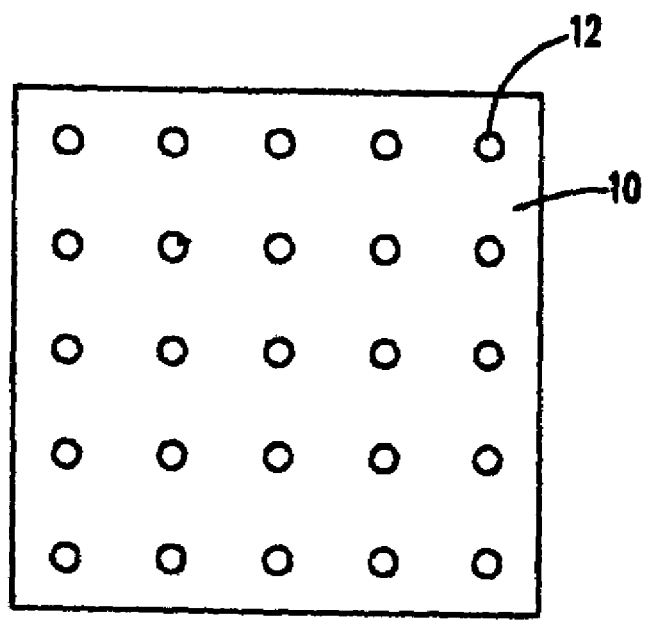
FIG. 2A depicts a top view of a flip-chip type semiconductor device having a plurality of controlled collapsed chip connection (C4) type terminals arranged on its top surface.

As indicated as the first step 1 of FIG. 1, an integrated circuit is divided into a plurality of areas. In the first step, the focus of this step is to isolate one or more portions of a chip to be tested. The area can be a window quadrant or the specific area. While this technique is especially used for chip analysis, any integrated circuit containing a substrate can benefit from this process (e.g., chips, wafers, arrays and chip assemblies). FIG. 2A depicts a top view of a flip-chip type semiconductor chip 10 having a plurality of C4 type terminals 12 on its top surface. More specifically, the chip 10 has twenty five terminals 12 arranged in a matrix of five rows and five columns. As will be apparent hereafter, however, the present invention is not limited to a certain type of chip or terminals, but broadly applicable to many kinds of integrated circuits which allow $I_{DDQ}$ current measurement through the terminals.

Figure 2B:
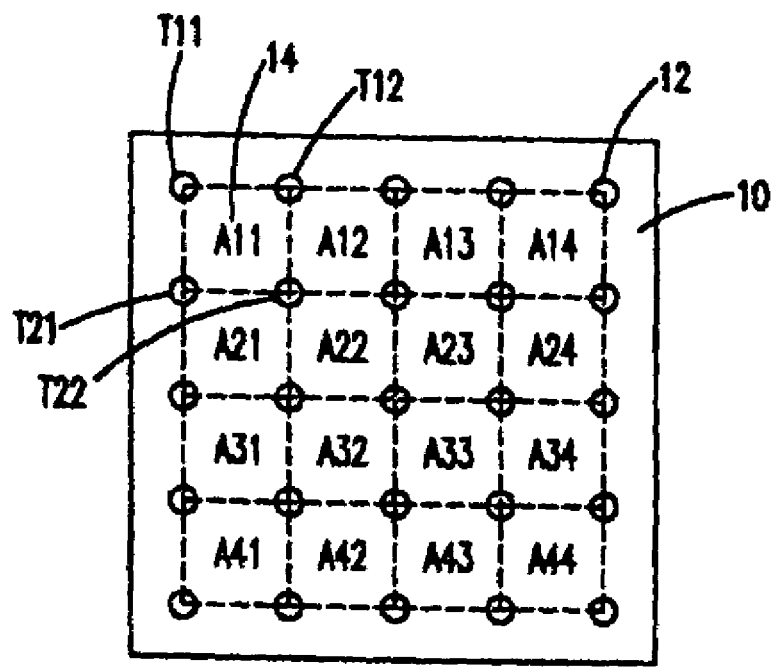
FIG. 2B depicts the top view of FIG. 2A, in which the top surface of the integrated circuit is divided into sixteen areas, each area bounded by the terminals, according to an embodiment of the present invention.
Figure 3A:
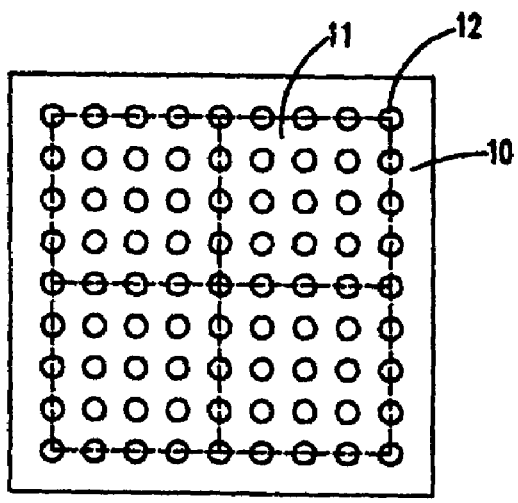
FIG. 3A depicts a top view of a flip-chip type semiconductor device having a plurality of C4 type terminals arranged on its top surface, and the top surface is divided into four areas, according to an embodiment of the present invention.
Figure 3B:
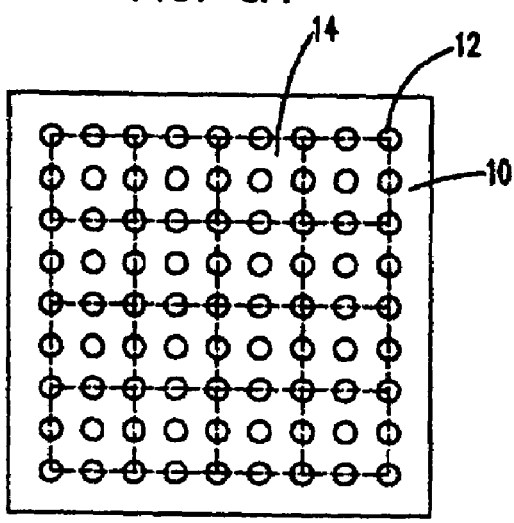
FIG. 3B depicts the top view FIG. 3A, in which the top surface is divided into sixteen areas, according to an embodiment of the present invention.
Figure 3C:
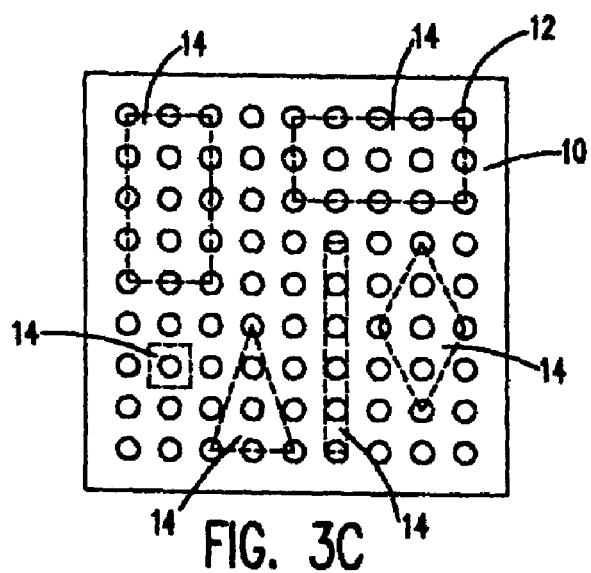
FIG. 3C depicts the top view of FIG. 3A, in which various shapes of areas are exemplarily arranged on the top surface, according to the present invention.

As depicted in FIG. 2B, the chip 10 is divided into a plurality of areas. More specifically, the top surface of the chip 10 is divided into sixteen areas A11 to A44. The areas are arranged in a matrix of four columns and four rows on the top surface. Depending on situations, the number, size, shape and arrangement of the areas can vary. For example, FIGS. 3A and 3B show a chip 10 divided into four areas and sixteen areas, respectively. Also, as shown in FIG. 3C, an area can be any kind of shape depending on situations and applications. One skilled in the art will be able to determine an appropriate number and shape of the area depending on the chip characteristics and other testing factors.

Once the chip 10 is divided into a plurality of areas 14, an $I_{DDQ}$ defect is activated, as shown as the second step 2 of FIG. 1. The activation of an $I_{DDQ}$ defect is well known in the art. For example, while Vdd and ground voltages are applied to a chip 10, the terminals 12 of the chip 10 are controlled to be in a lower power and low static current state, so called "quiescent state". During the quiescent state, all of the intended conductive paths within the chip 10 are turned off. If there is a defect, e.g., bridge or short on the conductive paths, the defect forms an unintentional conductive path between two or more active regions of the chip 10 and generates extra current (i.e., $I_{DDQ}$ defect current). To activate any possible defect, preferably several test patterns are applied to place the chip 10 into different electrical states, thereby increasing the likelihood of activating the $I_{DDQ}$ defect.

As depicted in the third step 3 in FIG. 1, the $I_{DDQ}$ defect current generated within each area is measured. As previously pointed out, conventional $I_{DDQ}$ testing schemes attempt to measure $I_{DDQ}$ defect current generated in the entire chip 10 by measuring the $I_{DDQ}$ defect at primary power/ground terminals. Thus, the $I_{DDQ}$ measurement was significantly interfered with by the background current generated by the cumulative amount of the leakage current of transistors in the chip 10.

This problem is solved by measuring the $I_{DDQ}$ defect current in an area-by-area basis. Since each area has significantly fewer transistors than the entire chip, the interference by the background current is significantly reduced. Thus, more accurate $I_{DDQ}$ defect test result is achieved.

According to a certain embodiment of the present invention, the $I_{DDQ}$ defect current generated within each area is measured by at least one terminal corresponding to each area or a plurality of terminals bounding each area. For example, in FIG. 2B, each area is provided with four terminals arranged at its four corners. Particularly, the $I_{DDQ}$ defect current generated within area A11 is measured at terminals T11, T12, T21 and T22.

In the same manner, the $I_{DDQ}$ defect current generated within other areas A12 to A44 are measured at their corresponding terminals arranged at the four corners. Thus, by measuring the $I_{DDQ}$ defect current in an area-by-area basis, more accurate $I_{DDQ}$ test result is achieved. Also, by adjusting the number, size, shape and arrangement of the areas 14 depending on the situation, a more accurate test result can be achieved.

Once $I_{DDQ}$ current measurement is completed, an $I_{DDQ}$ current map is created based on various data used for and acquired from the previous steps, as depicted in the fourth step 4 of FIG. 1. The $I_{DDQ}$ current map primarily illustrates the measured amount of $I_{DDQ}$ current within each area. By analyzing the $I_{DDQ}$ current map, particularly, the amount of the $I_{DDQ}$ defect current measured at each area, it is possible to identify areas which may include $I_{DDQ}$ defect.

Thus, based on the $I_{DDQ}$ current map, it is determined whether each area includes an $I_{DDQ}$ defect, as depicted as the fifth step 5 of FIG. 1. As conventionally known, whether each area 14 includes an $I_{DDQ}$ defect can be determined by a "go/no go" test, in which the $I_{DDQ}$ defect current measured at the terminals is compared to a predetermined value. Also, the determination can be made by performing a "delta current" test, in which $I_{DDQ}$ current measured at one group of pins is compared to that of another group to see whether there is any drop or increase in the amount of $I_{DDQ}$ current. Thus, according to the present invention, based upon the $I_{DDQ}$ current map, it is possible to perform a coarse diagnosis of the chip 10, in which it is determined whether the chip 10 or areas 14 include an $I_{DDQ}$ defect.

The present invention further enables determining the location of an $I_{DDQ}$ defect within each area, as shown in the sixth step 6 of FIG. 1. An $I_{DDQ}$ defect can be caused by several reasons. As discussed earlier, whether the area identified by the present invention includes the actual defect site depends on the defect type and physical layout of the chip. If the defect is a short between power and ground, for example, the defect will lie directly within the area identified. In the case of a defect, such as a signal line bridge, however, the source (i.e., Vdd terminals) or the sink (i.e., ground terminals) of the identified defect may not be the physical location of the defect itself.

Figure 4:
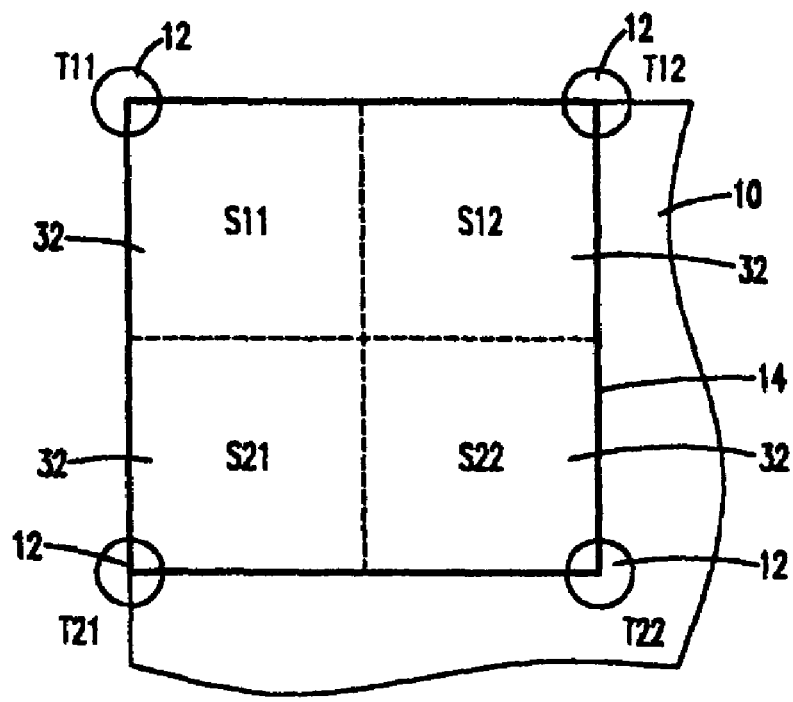
FIG. 4 depicts one of the areas depicted in FIG. 2B, in which the area is divided into four subsections, according to an embodiment of the present invention.

FIG. 2B depicts a top view of the chip 10 having twenty five terminals arranged on a grid of five rows and five columns on its top surface. Assuming that the area 14 has been determined to include an $I_{DDQ}$ defect from the previous coarse diagnosis step, the selected area 14 is divided into a plurality of subsections. For example, in FIG. 4, the area 14 is divided into four subsections S11, S12, S21 and S22 arranged in a matrix of two rows and two columns within the area 14. Each subsection 32 is provided with one of the terminals 12 bounding the selected area 14. Thus, the terminals T11, T12, T21 and T22 are provided corresponding to the subsections S11, S12, S21 and S22, respectively, as shown in FIG. 4.

Subsequently, an $I_{DDQ}$ defect is activated and $I_{DDQ}$ defect current generated in the selected area 14 is measured at the terminals T11, T12, T21 and T22. Based upon the amounts of the $I_{DDQ}$ defect current measured at the terminals T11, T12, T21 and T22, it is determined which subsection the $I_{DDQ}$ defect is located in.

For example, if an $I_{DDQ}$ defect is located at the center of the area 14, the amounts of the $I_{DDQ}$ defect current measured at the four terminals T11, T12, T21 and T22 would be the same. In this case, it is determined that the $I_{DDQ}$ defect is located at the center of the area 14.

If the $I_{DDQ}$ defect is located somewhere other than the center point, it is possible to determine which section the $I_{DDQ}$ defect is located in by comparing the amount of the $I_{DDQ}$ defect current measured at each terminal 12. For example, if the largest amount of the $I_{DDQ}$ defect current is measured at the terminal T11, it is determined that the $I_{DDQ}$ defect is located in the subsection S11.

Figure 5:
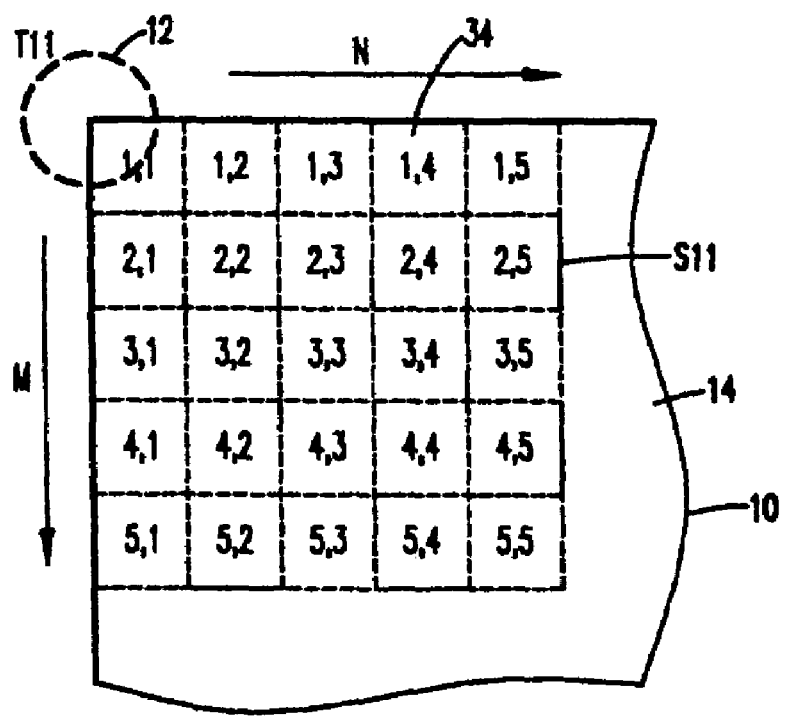
FIG. 5 depicts one of the sections depicted in FIG. 4, divided into twenty five sub-subsections arranged in a matrix comprising five rows and five columns, according to an embodiment of the present invention.

Assuming that the subsection S11 is determined to include the $I_{DDQ}$ defect, the subsection S11 is selected and divided into a plurality of sub-subsections. For example, FIG. 5 depicts the selected subsection S11 in FIG. 4 divided into twenty five sub-subsections 34. These sub-subsections 34 are arranged in a matrix of five rows and five columns within the selected subsection S11.

Once the sub-subsections 34 are defined within the selected subsection S11, it is determined which one of the sub-subsections 34 includes the $I_{DDQ}$ defect based on the ratio between the amount of the $I_{DDQ}$ defect current forwarded to the terminal T11 provided corresponding to the selected subsection S11 and the amount of a sum of the $I_{DDQ}$ defect current measured at each terminal T11, T12, T21 and T22.

Among the rows and columns, the row and column extending from the terminal T11 are defined to be the first row and column. Thus, since the terminal T11 is located at the upper left corner of the subsection S11, in FIG. 5, the first row of the subsection 11 is defined to be the group of the sub-subsections 34 arranged on the uppermost row, and the first column is defined to be the group of the sub-subsections 34 arranged on the leftmost column.

A ratio is used to calculate which row and column of the subsection 32 the $I_{DDQ}$ defect is located in. The amounts of the $I_{DDQ}$ defect current measured at the terminals T11, T12, T21 and T22 will be referred to as IT11, IT12, IT21 and IT22, respectively, hereafter.

In order to determine which row includes the $I_{DDQ}$ defect, a row ratio is determined by calculating the amount of a sum of the $I_{DDQ}$ defect current measured at the terminal T11 (IT11) and the $I_{DDQ}$ defect current measured at the terminal T12 (IT12). T12 is arranged in the same row with T11. This amount is then compared to the amount of the sum of the $I_{DDQ}$ defect current measured at each terminals T11, T12, T21 and T22 (IT11, IT12, IT21 and IT22), to calculate the row ratio. For example, the row ratio can be quantized by the following equation.

$R$ (Row Ratio)=$(IT11+IT12)/(IT11+IT12+IT21+IT22)$
If $R>0.75$, $M=1$ If $0.75>R>0.70$, $M=2$ If $0.70>R>0.65$, $M=3$ If $0.65>R>0.58$, $M=4$ If $0.58>R$, $M=5$ Here, R is the row ratio and M is the row of the subsection 32 including the $I_{DDQ}$ defect.

In a similar manner, which column includes the $I_{DDQ}$ defect is determined by calculating and quantizing a column ratio. For example, the column ratio is determined by calculating the amount of a sum of the $I_{DDQ}$ defect current measured at the terminal T11 (IT11) and the $I_{DDQ}$ defect current measured at the terminal T21 (IT21). T21 is arranged in the same column with T11. This amount is then compared to the amount of the sum of the $I_{DDQ}$ defect current measured at each terminals T11, T12, T21 and T22 (IT11, IT12, IT21 and IT22), to calculate the column ratio. Based on these amounts, the column ratio can be quantized by the following equation:

$C$ (Column Ratio)=$(IT11+IT21)/(IT11+IT12+IT21+IT22)$ If $C>0.75$, $N=1$ If $0.75>C>0.70$, $N=2$ If $0.70>C>0.63$, $N=3$ If $0.63>C>0.57$, $N=4$, If $0.57>C$, $N=5$ Here, C is the column ratio and N is the column of the subsection 32 including the $I_{DDQ}$ defect.

Based on the values of M and N, the $I_{DDQ}$ defect is determined to be located at the cross point of the Mth row and Nth column. Thus, the location of the $I_{DDQ}$ defect may be determined within a two-dimensional grid on an integrated circuit device by calculating and quantizing the ratio between (a) the amount of the $I_{DDQ}$ defect current forwarded toward the terminal provided for the subsection determined to include an $I_{DDQ}$ defect and (b) the amount of the sum of $I_{DDQ}$ defect current measured at each terminal.

Hence, the present invention enables a fine diagnosis of an integrated circuit, in which the location of an $I_{DDQ}$ defect is determined. Also, the location of an $I_{DDQ}$ defect within a specific area 14 might be determined by photon emission microscopy techniques or using software-based diagnostic tool. Once the location of the $I_{DDQ}$ defect is determined within the area 14, the $I_{DDQ}$ defect can be isolated by a variety of techniques.

Although only rectangular-shaped areas are shown therein, the present invention is not limited to such shapes, and different kinds of areas with different shapes, as illustrated in FIG. 3C, if necessary. Thus, according to the preferred embodiment of the present invention, any kind of area can be selected regardless of their size, location or shape. Furthermore, as will be clear to those skilled in the art, the teachings of the invention can be extended to three-dimensional volumes.

Thus, in addition to improving the "signal-to-noise" ratio in the $I_{DDQ}$ testing, the present invention provides various applications, for example, identification of the presence and location of an $I_{DDQ}$ defect within an integrated chip. The present invention can be used for other applications. For example, by performing the $I_{DDQ}$ test on a certain number of chips and creating a number of $I_{DDQ}$ current maps, it is possible to identify an $I_{DDQ}$ defect candidate area within the chips. Based on the identification, the $I_{DDQ}$ test can be initially performed on the $I_{DDQ}$ defect candidate area.

Figure 6:
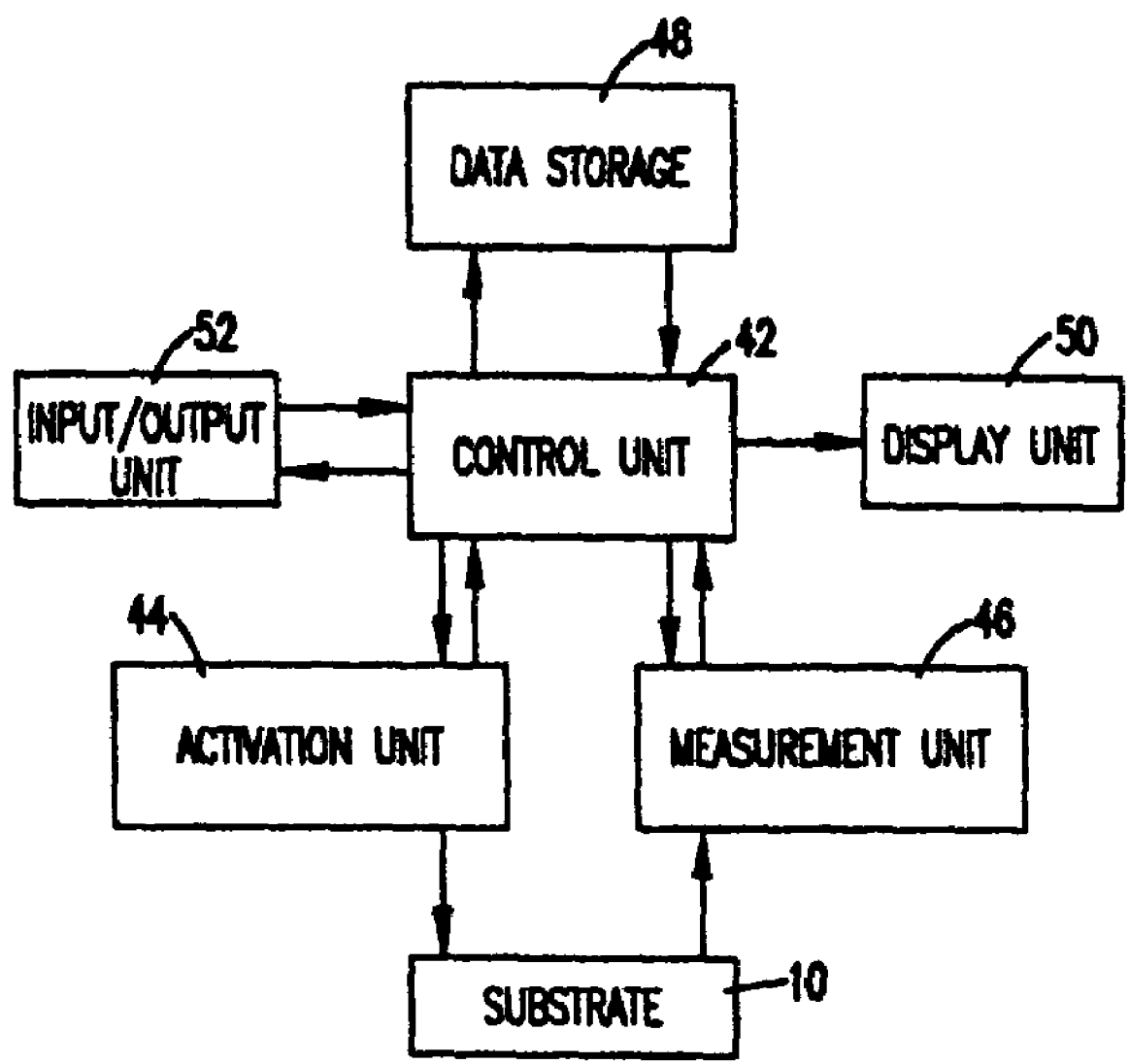
FIG. 6 depicts an apparatus for testing an integrated circuit, according to an embodiment of the present invention.

The foregoing methodology can be implemented as an apparatus or software to run such apparatus. FIG. 6 depicts an apparatus 40 for testing an integrated circuit, in accordance with the present invention. The apparatus 40 includes a control unit 42, which controls an activation unit 44 and a measurement unit 46. During the test, the activation unit 44 and measurement unit 46 form electrical contacts to a substrate 10 via terminals (not shown) provided on the substrate 10. The control unit 42 is also connected to data storage 48, input/output unit 52 and display unit 50.

Depending on the characteristics, e.g., chip configuration, of the substrate 10, the control unit 42 receives a test pattern for the substrate 10. The test pattern also can be received from the input/output unit 52. The control unit 42 provides the test pattern to the activation unit 44. The activation unit 44 makes necessary electrical contacts with the substrate 10 to set the substrate 10 in a low power/low current state and to apply the test pattern to the substrate 10 in order to activate an $I_{DDQ}$ defect within the substrate 10.

The measurement unit 46 measures $I_{DDQ}$ defect current generated within the substrate 10 via the terminals of the substrate 10. When performing the $I_{DDQ}$ testing, as previously described, the substrate 10 is divided into a plurality of areas. Thus, a number of electrical contacts are formed between the measurement unit 46 and the substrate 10 so that an amount of $I_{DDQ}$ defect current generated within each area is measured. If necessary, the measurement unit can be provided with a number of probes which form electrical contacts with all of the terminals of the substrate 10.

The measured values are processed by the control unit 42 to create an $I_{DDQ}$ current map of the substrate 10. The test result (e.g., the $I_{DDQ}$ current map) can be saved in the data storage 48 for the future use, or sent to the display unit 50 or the input/output unit 52 for further analysis. Also, based on the test result, the apparatus 40 can perform a coarse diagnosis of the substrate 10 based on the $I_{DDQ}$ current map, in which, it is determined whether one or more suspicious areas really include an $I_{DDQ}$ defect. Once one or more areas are determined to include an $I_{DDQ}$ defect, the apparatus 40 can further perform a fine diagnosis, in which the location of an $I_{DDQ}$ defect is determined.

Also, the apparatus unit 40 can be utilized solely for determining the location of an $I_{DDQ}$ defect within a specific area of an integrated circuit. The control unit 42 defines subsections and sub-subsections within the specific area, as previously described. The activation unit 44 activates an $I_{DDQ}$ defect, and the measurement unit 46 measures amounts of $I_{DDQ}$ defect current generated within the specific area via the terminals provided for the specific area. Based on the measured amounts of $I_{DDQ}$ defect currents, the control unit 42 determines which subsection and sub-subsection include the $I_{DDQ}$ defect based on the methodology described above.

While the invention has been described in terms of several embodiments, those skilled in the art will recognize that the invention can be practiced with modification within the spirit and scope of the appended claims.

What is claimed is:

1. A method of determining a location of an $I_{DDQ}$ defect within an area of an integrated circuit having a substrate and a plurality of terminals arranged on a surface of said substrate, said area provided with and bounded by corresponding ones of said plurality of terminals, respective terminals of said corresponding ones of said plurality of terminals carrying current flowing in respective portions of said area of said integrated circuit adjacent thereto, the method comprising steps of:

activating an $I_{DDQ}$ defect to generate $I_{DDQ}$ defect current within said integrated circuit;

measuring amounts of said $I_{DDQ}$ defect current at said respective ones of said corresponding terminals bounding said area; and determining the location of the $I_{DDQ}$ defect based on said amounts of $I_{DDQ}$ current measured at said respective ones of said corresponding terminals.

2. The method of claim 1, wherein the determining step further comprises the steps of:

dividing said area into a plurality of subsections, each subsection provided with a corresponding one of said terminals bounding said area; and determining which subsection includes said $I_{DDQ}$ defect based on said amounts of said $I_{DDQ}$ defect current measured at said corresponding terminals.

3. The method of claim 2, further comprising steps of:

selecting one of said subsections determined to include said $I_{DDQ}$ defect;

dividing said selected subsection into a plurality of sub-subsections; and determining which sub-subsection includes said $I_{DDQ}$ defect based on a ratio between an amount of $I_{DDQ}$ defect current forwarded toward one of said terminals provided for said selected subsection and an amount of a sum of said IDDQ defect current measured at said terminals bounding said area.

4. The method of claim 3, wherein said plurality of subsections are arranged in a matrix of X rows and Y columns within said area, and said plurality of sub-subsections are arranged in a matrix of M rows and N columns, wherein said X, Y, M and N are natural numbers.

5. The method of claim 4, wherein said step of determining which sub-subsection includes said $I_{DDQ}$ defect comprising the steps of:

determining which row of said selected subsection includes said $I_{DDQ}$ defect based on a ratio between (a) an amount of a sum of said $I_{DDQ}$ defect current measured at said terminal provided for said selected subsection and at a first neighboring terminal provided for one of said subsections arranged on a same row with said selected subsection and (b) said amount of said sum of said $I_{DDQ}$ defect current measured at said terminals bounding said selected area; and determining which column of said selected subsection includes said $I_{DDQ}$ defect based on a ratio between (a) an amount of a sum of said $I_{DDQ}$ defect current measured at said terminal provided for said selected subsection and at a second neighboring terminal provided for one of said subsections arranged on a same column with said selected subsection and (b) said amount of said sum of said $I_{DDQ}$ defect current measured at said terminals bounding said selected area.

6. A method for testing an integrated circuit substrate having a plurality of terminals on a surface thereof, the method comprising the steps of:

dividing said surface into a plurality of areas;

activating an $I_{DDQ}$ defect to generate $I_{DDQ}$ defect current within said integrated circuit; and measuring an amount of said $I_{DDQ}$ defect current generated within each area.

7. The method of claim 6, wherein each area has at least one terminal corresponding thereto.

8. The method of claim 6, further comprising the step of determining whether each area includes said $I_{DDQ}$ defect based on said amount of said $I_{DDQ}$ defect current measured at said at least one terminal.

9. The method of claim 8, wherein said determining step includes the step of comparing the $I_{DDQ}$ defect current measured at each area with a preselected value.

10. The method of claim 8, further comprising the step of determining a location of said $I_{DDQ}$ defect within said integrated circuit substrate.

11. The method of claim 10, wherein said step of determining the location of said $I_{DDQ}$ defect comprises the steps of:

selecting one of said areas determined to include said $I_{DDQ}$ defect;

dividing said selected area into a plurality of subsections, each subsection provided with a corresponding one of said terminals bounding said selected area; and determining which subsection includes said $I_{DDQ}$ defect based on said amount of the $I_{DDQ}$ defect current measured at said terminals bounding said selected area.

12. The method of claim 11, further comprising the steps of:

selecting one of said subsections determined to include said $I_{DDQ}$ defect;

dividing said selected subsection into a plurality of sub-subsections; and determining which sub-subsection includes said $I_{DDQ}$ defect based on the ratio between (a) an amount of said $I_{DDQ}$ defect current forwarded to said terminal provided for said selected subsection and (b) an amount of a sum of said $I_{DDQ}$ defect current measured at said terminals bounding said selected area.

13. The method of claim 12, wherein said plurality of subsections are arranged in a matrix of X rows and Y columns within said selected area, and said plurality of sub-subsections are arranged in a matrix of M rows and N columns within said selected subsection, wherein X, Y, M and N are natural numbers.

14. The method of claim 13, wherein said step of determining which sub-subsection includes said $I_{DDQ}$ defect comprises the steps of:

determining which row of said selected subsection includes said $I_{DDQ}$ defect based on a ratio between (a) an amount of a sum of said $I_{DDQ}$ defect current measured at said terminal provided for said selected subsection and at a first neighboring terminal provided for one of said subsections arranged on a same row with said selected subsection and (b) said amount of said sum of said $I_{DDQ}$ defect current measured at said terminals bounding said selected area; and determining which column of said selected subsection includes said $I_{DDQ}$ defect based on a ratio between (a) an amount of a sum of said $I_{DDQ}$ defect current measured at said terminal provided for said selected subsection and at a second neighboring terminal provided for one of said subsections arranged on a same column with said selected subsection and (b) said amount of said sum of said $I_{DDQ}$ defect current measured at said terminals bounding said selected area.

15. A method for testing an integrated circuit substrate having a plurality of terminals on a surface thereof, the method comprising the steps of:

dividing said surface into a plurality of areas, each area provided with at least one of said plurality of terminals;

activating an $I_{DDQ}$ defect to generate $I_{DDQ}$ defect current within said integrated circuit; and measuring an amount of said $I_{DDQ}$ defect current generated within each area;

creating an $I_{DDQ}$ current map of said integrated device based on said amounts of said $I_{DDQ}$ defect current measured at said plurality of terminals;

determining whether each area includes said $I_{DDQ}$ defect based on said $I_{DDQ}$ current map; and determining a location of said $I_{DDQ}$ defect within said integrated circuit substrate based on said $I_{DDQ}$ current map.

16. The method of claim 15, further comprising the step of isolating said $I_{DDQ}$ defect within said integrated circuit substrate.

17. The method of claim 15, wherein said testing method is performed on a plurality of integrated circuit substrates to create a plurality of $I_{DDQ}$ current maps.

18. The method of claim 17, further comprising step of determining an $I_{DDQ}$ defect candidate area among said plurality of areas based on said plurality of $I_{DDQ}$ current maps.

19. A method for diagnosing a location of an $I_{DDQ}$ defect in an integrated circuit substrate having a plurality of terminals on a surface thereof, the method comprising the steps of:

dividing said surface into a plurality of areas, each area being provided with at least one of said plurality of terminals;

applying a plurality of test patterns to said integrated circuit substrate, each test pattern placing said integrated circuit into a different electrical state;

measuring an amount of current generated in each area of said integrated circuit substrate during each test pattern applied thereto;

determining which of said plurality of test patterns activate the $I_{DDQ}$ defect and which of said plurality do not activate the $I_{DDQ}$ defect based on the measured amount of the current generated in each area; and using the determination result for said test patterns as data input to a diagnostic tool capable of modeling various $I_{DDQ}$ defects and comparing a predicted activation behavior to said determination results.

* * * * *